Dec. 24, 1968 R. A. FORREST 3,418,182

HIGH CONCENTRATION DOPING OF SILICON USING AMMONIUM PHOSPHATE

Filed July 26, 1965

WITNESSES

*Theodore F. Wrobel*

*Donald M. Winegar*

INVENTOR.
Richard A. Forrest

BY

*C. L. Menzemer*

ATTORNEY

United States Patent Office 3,418,182

Patented Dec. 24, 1968

3,418,182

HIGH CONCENTRATION DOPING OF SILICON USING AMMONIUM PHOSPHATE

Richard A. Forrest, Greensburg, Pa., assignor to Westinghouse Electric Corporation, Pittsburgh, Pa., a corporation of Pennsylvania Filed July 26, 1965, Ser. No. 474,777

5 Claims. (Cl. 148—188)

ABSTRACT OF THE DISCLOSURE

A high concentration doping of a body of semiconductor material comprises the utilization of ammonium phosphate as a source of the dopant phosphorus. Ammonium phosphate is first preheated to an elevated temperature. Dry oxygen gas is then caused to flow over the source, the oxygen gas reacting with the ammonium phosphate vapor to produce at least phosphorus pentoxide which is deposited by the gas flow on a heated surface of a suitable substrate. The phosphorus pentoxide reacts with the semiconductor material of the surface it is deposited upon forming elemental phosphorus. Deep diffusion of the phosphorus is accomplished in a separate diffusion process carried out in an inert atmosphere.

This invention relates, generally, to the processing of semiconductive material for the fabrication of semiconductor devices and, more particularly, to the formation of deep P-N junctions in silicon by the diffusion of phosphorus.

It is an object of this invention to provide a method for the deep diffusion of phosphorus into silicon in which the surface concentrations of phosphorus achieved in the silicon exceeds $10^{21}$ atoms per cubic centimeter at the silicon surface.

It is another object of this invention to provide a method for the diffusion of phosphorus into silicon in which a deep junction of 25 microns or greater is achieved.

Other objects of the invention will, in part, be obvious and will, in part, appear hereinafter.

For a better understanding of the nature and objects of the present invention, reference should be had to the following detailed description and drawings, in which.

In accordance with the present invention and attainment of the foregoing objects, there is provided a process for forming a deep p-n junction in a body of semiconductor material by diffusing phosphorus into the body of a semiconductor material to a shallow depth and at a high concentration, and thereafter diffusing the phosphorus to the greater depth.

More specifically, a body of semiconductor material is preheated to a predetermined temperature in one portion of a furnace. Ammonium phosphate is heated to a predetermined temperature in a second portion of a furnace. A gas is caused to flow over the heated ammonium phosphate. The gas reacts with the ammonium phosphate to produce phosphorus pentoxide. The phosphorus pentoxide is then carried by the gas which, in turn, is caused to flow over a surface of the body of semiconductor material. Molecules of the phosphorus pentoxide deposit onto the surface of the body. The phosphorus pentoxide reacts chemically with the semiconductor material to free elemental phosphorus which is then diffused into the body of semiconductor material to a shallow depth. Thereafter, the phosphorus is diffused to the desired depth.

Figure 1:
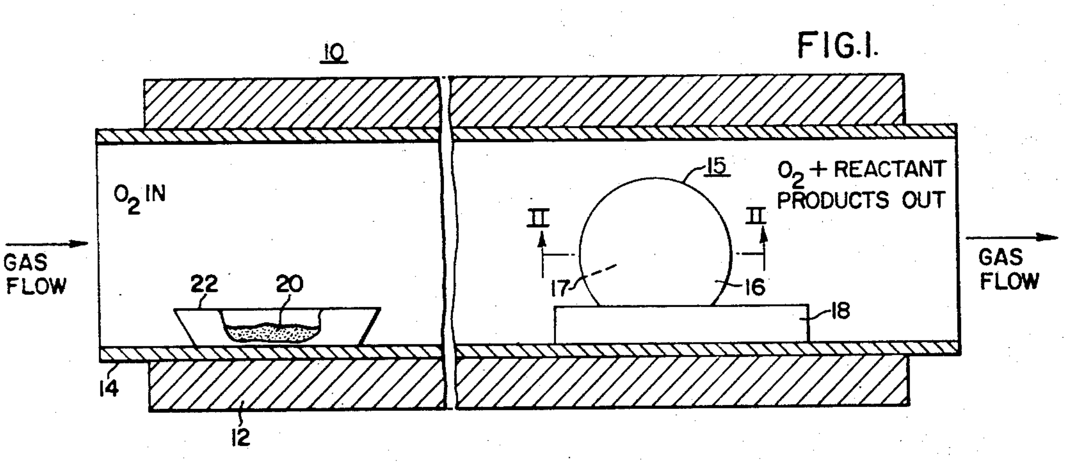
FIGURE 1 is a view, partly in cross-section, of a system for diffusing phosphorus into a silicon body in accordance with the teachings of this invention.

Referring to FIG. 1, there is shown a system 10 suitable for performing the phosphorus diffusion in accordance with the teachings of this invention.

The system 10 comprises a suitable open tube furnace 12. The furnace 12 has a circular wall 14. A body 15 of suitable semiconductor material is disposed on a suitable carrier 18 in one portion of the furnace 12. The semiconductor material may be silicon, germanium, silicon carbide and Group III–V compounds as well as Group II–VI compounds, and has a p-type semiconductivity and a resistivity of at least one-tenth ohm-centimeter. A resistivity of from 5 ohm-centimeter to 500 ohm-centimeter or more is preferred.

The carrier 18 may be comprised of any suitably compatible material known to those skilled in the art such, for example, as quartz.

For purposes of ease of description, and for no other reason, the invention will be described in terms of processing of silicon.

The body 15 which is made of silicon semiconductor material and has flat faces 16 and 17 is disposed within the tube 14 of the furnace 12 in an upright position. The flat faces 16 and 17 of the body 15 are parallel to the length of the tube 14. The body 15 of silicon is then heated to a temperature of from 1100° C. to 1300° C. A temperature of 1200° C. ±1° C. is preferred. The body 15 and the carrier 18 are held at this temperature to allow them to come into thermal equilibrium with the furnace 12.

A preweighed amount of ammonium phosphate 20 is placed in a crucible 22 made of a suitable material, such, for example, as quartz. The crucible 22 containing the ammonium phosphate 20 is placed in another portion of the furnace 12. The ammonium phosphate 20 is heated to a temperature of from 500° C. to 950° C. A preferred temperature is 840° C. ±5° C.

A suitable dry reactant gas such, for example, as oxygen, is then caused to flow across the crucible 22 of ammonium phosphate 20 towards the body 15.

The reactant gas has a gas flow rate of from 0.5 to 3.0 cubic feet per minute and comes into contact with the ammonium phosphate. A chemical reaction follows which produces at least one reactant product which is phosphorus pentoxide. The phosphorus pentoxide is carried by the gaseous oxygen, along with the other reactant products, and is caused to flow over the surfaces of the silicon body 15. Molecules of phosphorous pentoxide deposit on the surfaces of the body 15 of silicon. The phosphorus pentoxide chemically reacts with the silicon and frees elemental phosphorus which diffuses into the body 15. The exact amount of phosphorus diffused into the body 15 is dependent on the length of time that the body 15 is exposed to the phosphorus pentoxide.

In order to achieve a deep junction device embodying the teachings of this invention, the surfaces of the substrate must achieve a high surface concentration of phosphorus during deposition time that it is in the furnace.

Figure 2:
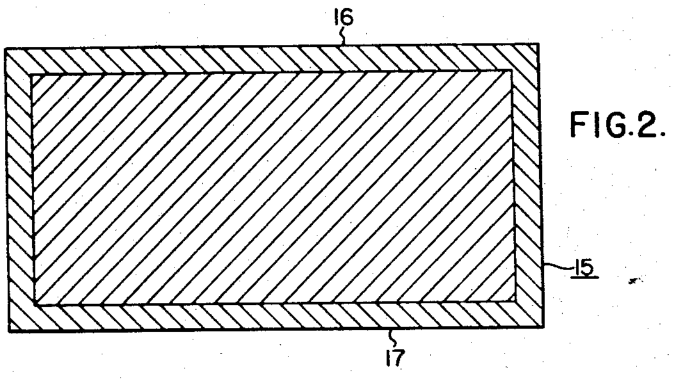
FIG. 2 is a cross-sectional view of the body shown in FIG. 1 taken on the lines II—II.

With reference to FIG. 2, there is shown a cross-sectional view of the body 15 illustrating how the phosphorus is diffused into all surfaces exposed to the phosphorus pentoxide.

Figure 3:
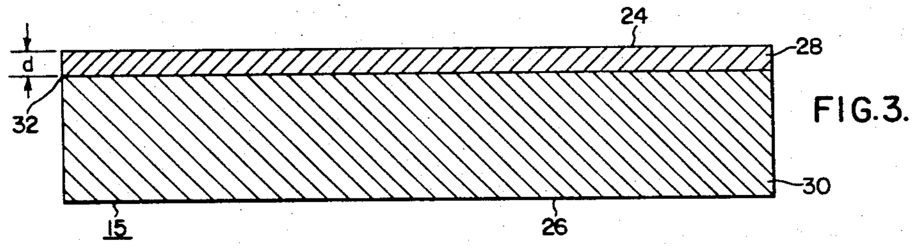
FIGS. 3 and 4 are cross-sectional views of the body shown in FIG. 2 after further processing in accordance with the teachings of this invention.

Referring to FIG. 3, there is shown the body 15 of silicon, in cross-section, suitably prepared in accordance with the teachings of the invention for making a deep junction device.

The body 15 has had all extraneous phosphorus portions removed. The body 15 has a top surface 24 and a bottom surface 26. Phosphorus has been diffused through the top surface 24 to create a layer 28 of n-type semiconductivity of a depth *d* in the body 15. The body 15 which initially comprised all p-type semiconductivity material now has only a layer 30 of p-type semiconductivity. A p-n junction 32, or a semiconductor transition region, exists at the interface between the two layers 28 and 30.

The p-n junction 32 is then redistributed to a depth of from 25 to 100 microns by a second suitably thermal diffusion process.

Figure 4:
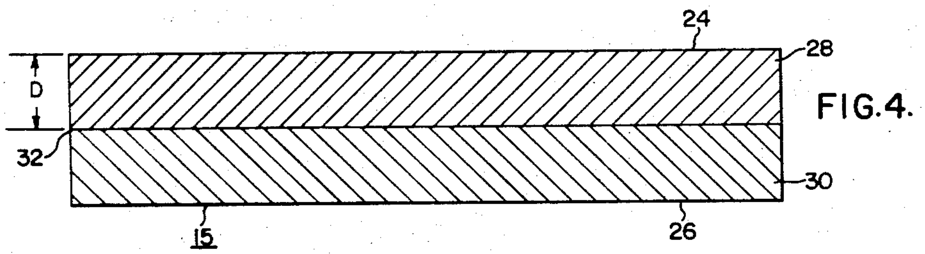

FIG. 4 illustrates the body 15 of silicon after the p-n junction 32 is redistributed to a depth D by suitable means known to those skilled in the art. An example of one such process is to dispose the phosphorus diffused body 15 of silicon of FIG. 3 in a closed furnace having an inert atmosphere. The body 15 is raised to an elevated temperature of from 1200° C. to 1350° C. where it is maintained at the desired temperature for a sufficient length of time to enable the phosphorus to diffuse deeper into the body 15 of silicon.

The time required to obtain a given depth D for the p-n junction 32 is dependent upon several factors. The higher the temperature employed for redistribution, the faster redistribution will generally occur. The resistivity of the body 15 of semiconductor material is another factor affecting the time at furnace temperature.

The layer 28 may have a thickness equal to from 60 to 70 microns. That is to say the p-n junction 32 is now located at a distance of from 60 to 70 microns from the top surface 24.

One appreciates of course that the temperature and times required for processing semiconductor materials of germanium, silicon carbide and Group III–V as well as Group II–VI compounds of the periodic table will differ accordingly from those required for processing silicon in accordance with the teachings of this invention.

Example I

A body of silicon semiconductor material having p-type semiconductivity and a resistivity of 45 ohm-centimeter was prepared in a conventional manner known to those skilled in the art. The body was disposed vertically in a quartz carrier. The carrier was then disposed in one end of an open tube furnace in such a manner that the two large flat opposing surfaces of the body were parallel to the length of the tube of the furnace.

Into the other end of the open tube furnace was disposed a crucible containing 5 grams ±0.5 gram of ammonium phosphate.

The portion of the open tube furnace containing the body of silicon was brought to an elevated temperature and thermally stabilized at a temperature of 1200° C. ±1° C. for the body of silicon. The portion of the open tube furnace containing the ammonium phosphate was raised to an elevated temperature until the ammonium phosphate was thermally stabilized at 850° C. ±5° C.

When both the ammonium phosphate and the body of silicon reached thermal equilibrium at their respective elevated temperatures, a stream of dry oxygen gas was introduced into one end of the open tube furnace. The dry oxygen gas was first passed over the exposed surface of ammonium phosphate and then caused to flow over the exposed surfaces of the body of silicon. The gas was then exhausted from the open tube furnace through the end opposite from the entrance where the gas was introduced into the furnace.

The dry oxygen gas flowed through the furnace at a flow rate of from 1.0 to 1.5 cubic feet per minute for a period of 25 minutes ±0.5 minute.

Upon removal from the furnace the thickness of the phosphorus diffused layer was found to be 6 microns. The concentration of the phosphorus in the silicon was approximately $2\times10^{21}$ atoms per square centimeter of the surface of the body of silicon. This high concentration of phosphorus was greater than any of the concentrations obtainable by prior art processes.

The phosphorus doped layers of silicon were removed from all except one major flat surface of the body. The body was then placed in a second open tube furnace having an inert gas flowing through it. The body of silicon containing the phosphorus doped layer was brought to thermal equilibrium at 1300° C. ±1° C. for 13 hours ±0.1 hour.

The body of silicon was removed from the second open tube furnace and examined. It was found that the p-n junction was now located 60 microns below the surface through which the phosphorus had been introduced. In other words, the layer of n-type semiconductivity was 60 microns thick.

The phosphorus diffusion method embodying the teachings of this invention provides a fast, reproducible and extremely economical process for forming deep P-N junctions in a body of P-type silicon or other semiconductor material.

While the invention has been described with reference to particular embodiments and examples, it will be understood, of course, that modifications, substitutions and the like may be made therein without departing from its scope.

What is claimed is:

1. A method for producing a phosphorus diffused layer in a body of silicon semiconductor material comprising (1) preheating said body of silicon to a temperature of from 1100° C. to 1300° C., (2) maintaining said body of silicon in thermal equilibrium at said temperature of from 1100° C. to 1300° C., (3) heating a mass of ammonium phosphate to a temperature of from 500° C. to 950° C., (4) passing an oxygen gas over said heated ammonium phosphate at a gas flow rate of from 0.5 to 3.0 cubic feet per minute, (5) reacting a portion of said gas with said heated ammonium phosphate to produce at least the chemical compound phosphorus pentoxide, (6) passing said phosphorus pentoxide and the remaining portion of said oxygen gas over exposed surface layers of said heated body of silicon, (7) depositing said phosphorus pentoxide on said exposed surface layers of said body, (8) reacting said phosphorus pentoxide with the silicon in said surface layers of said body to produce at least the element phosphorus in said surface layers of said body, and (9) heating said body of silicon having phosphorus in said surface layers in an inert atmosphere at a temperature of from 1200° C. to 1350° C. for a sufficient time to diffuse the phosphorus in said surface layers to a greater predetermined depth within said body of silicon.

2. A method for producing a phosphorus diffused layer in a body of silicon semiconductor material comprising (1) preheating said body of silicon to a temperature of 1200° C. ±1° C., (2) maintaining said body of silicon in thermal equilibrium at said temperature of 1200° C. ±1° C., (3) heating a mass of ammonium phosphate to a temperature of from 500° C. to 950° C., (4) passing an oxygen gas over said heated ammonium phosphate at a gas flow rate of from 0.5 to 3.0 cubic feet per minute, (5) reacting a portion of said gas with said heated ammonium phosphate to produce at least the chemical compound phosphorus pentoxide, (6) passing said phosphorus pentoxide and the remaining portion of said oxygen gas over exposed surface layers of said heated body of silicon, (7) depositing said phosphorus pentoxide on said exposed surface layers of said body, (8) reacting said phosphorus pentoxide with the silicon in said surface layers of said body to produce at least the element phosphorus in said surface layers of said body, and (9) heating said body of silicon having phosphorus in said surface layers in an inert atmosphere at a temperature of from 1200° C. to 1350° C. for a sufficient time to diffuse the phosphorus in said surface layers to a greater predetermined depth within said body of silicon.

3. The method of claim 2 in which the mass of ammonium phosphate is 5 grams ±0.05 gram.

4. The method of claim 2 in which the mass of ammonium phosphate is heated to 840° C. ±5° C.

5. The method of claim 2 in which the mass of ammonium phosphate is heated to 840° C. ±5° C. and the oxygen gas is dry and flowing at a rate of from 1.0 to 1.5 cubic feet per minute.

References Cited

UNITED STATES PATENTS

| | | | |
|---|---|---|---|
| 3,194,701 | 7/1965 | Lothrop | 148—188 X |
| 2,974,073 | 3/1961 | Armstrong. | |
| 3,183,129 | 5/1965 | Tripp | 148—186 |
| 3,244,567 | 4/1966 | Crishal | 148 |

HYLAND BIZOT, *Primary Examiner.*